United States Patent [19]
Dent

[11] Patent Number: 5,643,000
[45] Date of Patent: Jul. 1, 1997

[54] METHOD AND APPARATUS FOR PROVIDING PROCESSOR FIELD UPGRADABILITY TO A MOTHERBOARD

[75] Inventor: Dave Dent, Beaverton, Oreg.

[73] Assignee: Intel Corporation, Santa Clara, Calif.

[21] Appl. No.: 691,859

[22] Filed: Jul. 31, 1996

Related U.S. Application Data

[63] Continuation of Ser. No. 313,431, Sep. 27, 1994, abandoned.

[51] Int. Cl.$^6$ .................................................. H01R 9/09
[52] U.S. Cl. ..................................... 439/69; 29/840
[58] Field of Search ............................ 439/69, 70, 525; 29/840

[56] References Cited

U.S. PATENT DOCUMENTS

| | | | |
|---|---|---|---|
| 4,116,519 | 9/1978 | Grabbe et al. | 439/69 OR |
| 4,356,532 | 10/1982 | Donaher et al. | 439/69 X |
| 4,632,293 | 12/1986 | Feinstein | 29/840 X |
| 4,696,525 | 9/1987 | Coller et al. | 439/69 OR |
| 4,883,428 | 11/1989 | Tonooka | 439/69 OR |
| 5,346,402 | 9/1994 | Yasuho et al. | 439/69 X |

*Primary Examiner*—Gary F. Paumen
*Assistant Examiner*—Daniel Wittels
*Attorney, Agent, or Firm*—Blakely, Sokoloff, Taylor & Zafman

[57] ABSTRACT

Certain critical dimensions of an original microprocessor package, an upgrade socket, and an upgrade microprocessor package are made complementary to one another, enabling the upgrade socket to be wave soldered onto an area of the motherboard that encircles the area on which the original microprocessor package is surface mounted, and the upgrade microprocessor package remains capable of mating with the upgrade socket. In an alternate embodiment, in addition to having the various critical dimensions of the original microprocessor package, the upgrade socket and the upgrade microprocessor package coordinated with one another, the bottom portion of the upgrade socket is modified to have a smaller center cut out than the top portion of the upgrade socket, allowing a step to be exposed around the perimeter of the center cut out, and the original microprocessor package to be first solder mounted onto the new step, before the entire original microprocessor package and upgrade socket combination is wave soldered onto the motherboard.

5 Claims, 5 Drawing Sheets

METHOD AND APPARATUS FOR PROVIDING PROCESSOR FIELD UPGRADABILITY TO A MOTHERBOARD

This a continuation of application Ser. No. 08/313,431, filed Sep. 27, 1994, now abandoned.

BACKGROUND OF THE INVENTION

1. Field of the Invention

The present invention relates to the field of computer systems. In particular, the present invention relates to field upgrading the processor of a computer system.

2. Background Information

As microprocessor technology continues to evolve in a faster and faster pace. Purchasers of microprocessor based computer systems demand better performance scalability from the system manufacturers to protect their investment. A particular aspect of performance scalability is the ability to field upgrade the original microprocessor to at least one newer generation of microprocessor.

FIG. 1 illustrates a typical prior art approach to field upgrading the microprocessor of a computer system. The original microprocessor package 10 is surface mounted onto a main circuit board 14, also known as the motherboard. For the illustrated embodiment, the original microprocessor package is a rectangular plastic quad flat pad (PQFP) package having connecting leads 32 extending outward along the perimeter. The leads 32 are soldered to physically and electrically connect with a land grid pattern (not shown) pre-disposed on the motherboard 14. The land grid pattern in turn is physically and electrically connected to the interconnect wiring circuitry (not shown) embedded "inside" the motherboard 14.

A processor upgrade socket 12 (hereinafter, upgrade socket) having the proper electrical "connectors" 28 designed to receive and mate with an upgrade microprocessor package (not shown), is wave soldered onto the motherboard 14 in a vicinity immediately adjacent to the surface mounted original microprocessor package 10. For the illustrated embodiment, the upgrade socket 12 is a zero insertion force (ZIF) upgrade socket having three major parts, the base portion 16, the top portion 18, and a lever mechanism 20. Each of the base as well as the top portions 16 and 18 has a center cut out 24. The electrical "connectors" 28, which are receptacle holes for the illustrated embodiment, are disposed in part in the base portion 16, and in part in the top portion 18. The bottom portion 16 further includes a number of connecting pins (not shown) disposed on its bottom surface 30. These connecting pins are wave soldered through the motherboard 14, making contacts with the embedded interconnect wiring circuitry inside the motherboard 14.

Furthermore, the top portion 18 is adapted to laterally "slide" on top of the bottom portion 16. The lateral sliding movement is controlled by the lever mechanism 20. The upgrade socket 12 is illustrated in an "open" position. The upgrade socket 12 is laterally "slid" into a "closed" position after the upgrade microprocessor package is mounted onto the upgrade socket 12 by having its pins inserted into the receptacle holes 28. At the "closed" position, the center cut outs 24 as well as the two portions of each of the receptacle holes 28 are aligned, securing the physical as well as the electrical contacts between the pins of the upgrade microprocessor package and the receptacle holes 28 of the upgrade socket 12. The amount of lateral "sliding" going from the "open" position to the "close" position is very small (1–2 cm). The amount of lateral displacement shown, as evident by the amount of exposed lower portion 26a and 26b, is exaggerated for illustrative purpose.

In other words, the original microprocessor package 10 and the upgrade socket 12 are disposed side by side to each other on the motherboard 14. This side by side approach has the advantage that the upgrade microprocessor may operate as a co-processor to the original microprocessor, since the upgrade microprocessor will not be obstructing thermal dissipation of the original microprocessor, turning the computer system into a multi-processor system. However, this advantage is enjoyed by few systems, since the overwhelming majority of field upgraded systems remain uniprocessor systems.

On the other hand, this side by side approach has the disadvantage that more than twice the amount of motherboard real estate are required, when compared to the historic case where field upgradability is not provided. As the scale of integration continues to increase, more traditional add-on functions such as video add-on cards are being integrated as standard functions of the motherboard 14 and compete for the same scarce motherboard real estate. Another disadvantage is the long trace lengths required between the original CPU and the upgrade CPU, which can become a problem for the emerging faster processors requiring immediate access to the "off-chip" cache memory. Thus, it is increasing desirable to be able to provide an alternative approach to CPU field upgradability requiring less motherboard real estate, especially when the "multi-processor" advantage is seldom exploited.

As will be disclosed in more detail below, the present invention provides for methods and apparatus for providing processor field upgradibility to a motherboard that achieves these and other desirable results.

SUMMARY AND OBJECTS OF THE INVENTION

In one embodiment, the desirable results are advantageously achieved by providing an original microprocessor package, an upgrade socket, and an upgrade microprocessor package having certain critical dimensions complementary to one another, to enable the upgrade socket to be wave soldered onto an area of the motherboard that encircles the area on which the original microprocessor package is surface mounted, and the upgrade microprocessor package remains capable of mating with the upgrade socket. More specifically, the external dimensions of the original microprocessor package and the internal dimensions of the center cut out of the upgrade socket are designed to complement each other, and the upgrade microprocessor package is correspondingly resized to complement the adjusted dimensions of the upgrade socket.

In an alternate embodiment, in addition to having the various critical dimensions of the original microprocessor package, the upgrade socket and the upgrade microprocessor package coordinated with one another, the bottom portion of the upgrade socket is modified to have a smaller center out than the top portion of the upgrade socket, allowing a step to be exposed around the perimeter of the center cut out. A land grid pattern is formed on the steps, and interconnect wiring circuitry is provided on the bottom part of the upgrade socket to connect the land grid pattern to the receptacle holes of the upgrade socket. The original microprocessor package is first solder mounted onto the new step of the upgrade socket, and then the original microprocessor package and upgrade socket combination is wave soldered onto the motherboard.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, for purposes of explanation, specific numbers, materials and configurations are set forth in order to provide a thorough understanding of the present invention. However, it will be apparent to one skilled in the art that the present invention may be practiced without the specific details. In other instances, well known features are omitted or simplified in order not to obscure the present invention.

Figure 1:
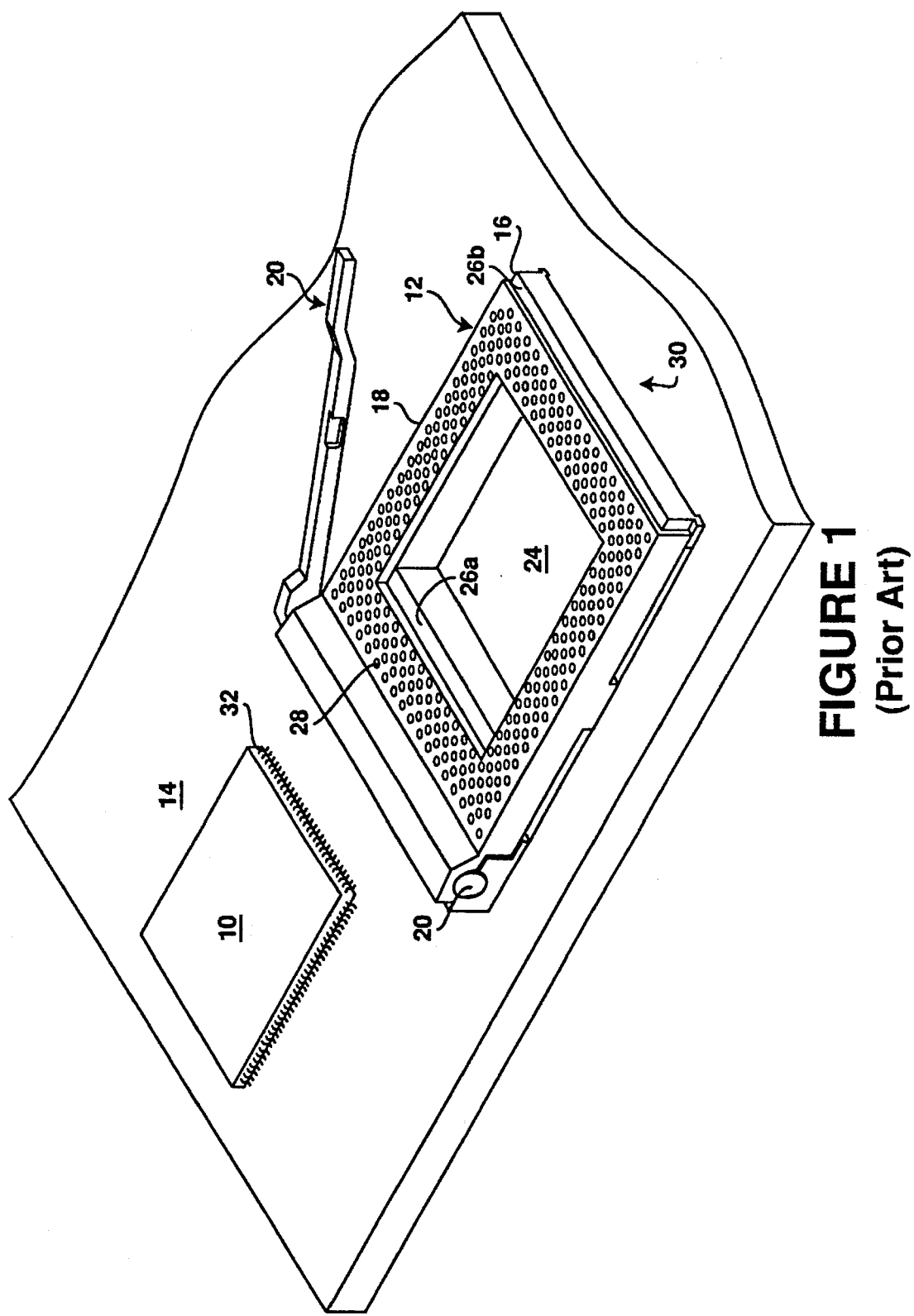
FIG. 1 illustrates a typical prior art approach to providing processor field upgradability to a motherboard.
Figure 2:
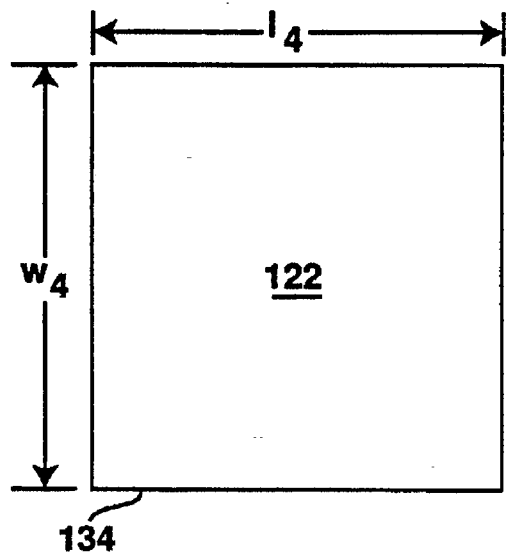
FIGS. 2–3 illustrate one embodiment of the present invention, wherein the original processor package is surface mounted onto the motherboard in the interior area defined by the center cut out of the upgrade socket.
Figure 2:
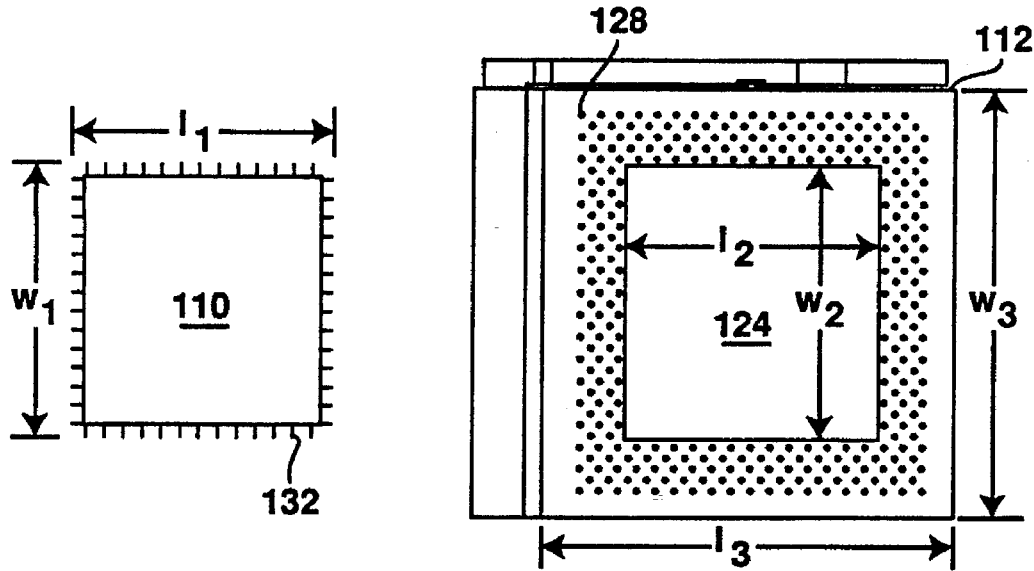
Figure 3:
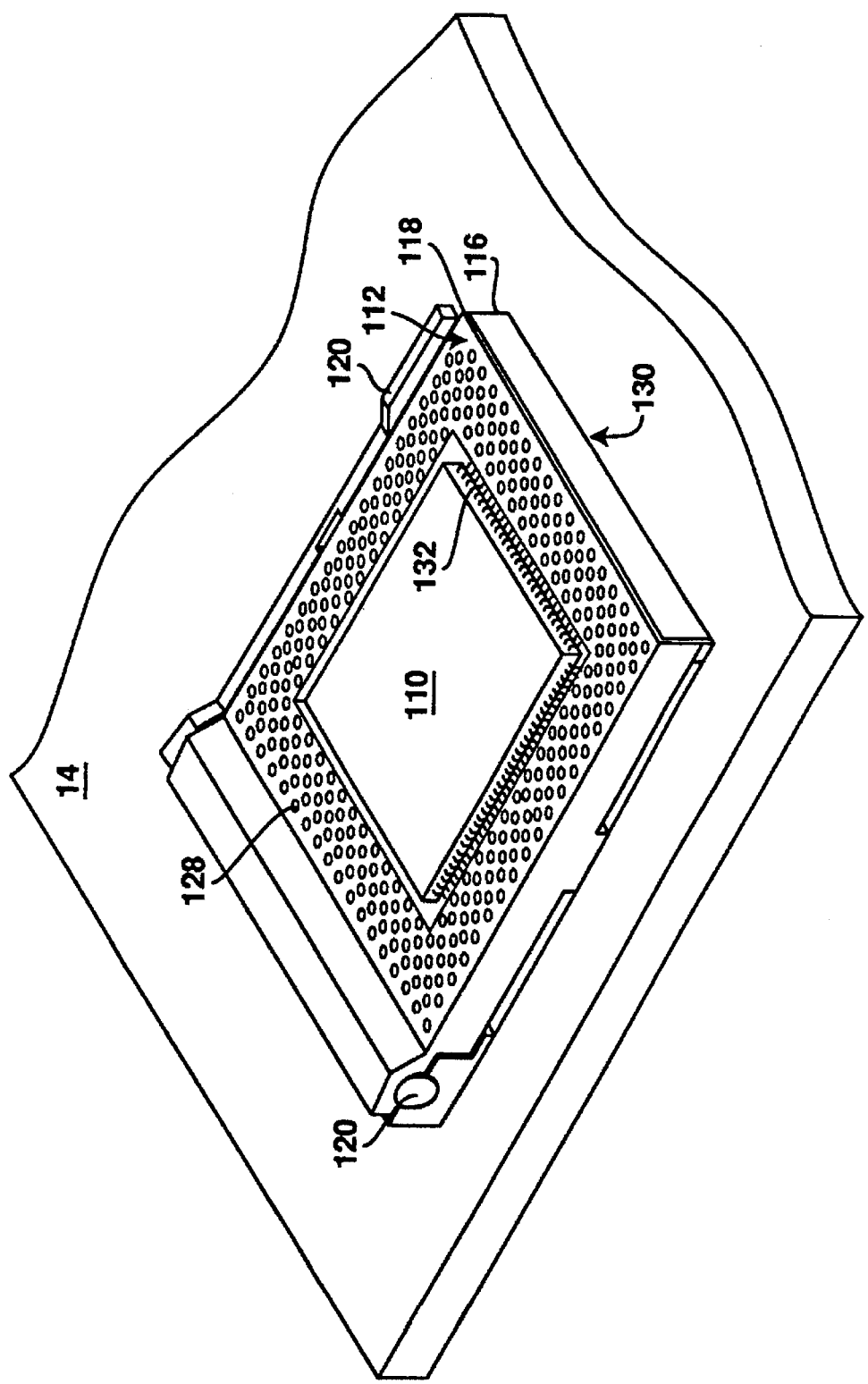

Referring now to FIGS. 2 and 3 which illustrate one embodiment of the present invention. Certain critical dimensions of original microprocessor package 110 and upgrade socket 112 are resized in a complementary manner. More specifically, the external dimensions ($L_1 \times W_1$) of original microprocessor package 110, including extending leads 132, and the internal dimensions ($L_2 \times W_2$) of center cut out 124 of upgrade socket 112, are complementary sized, such that original microprocessor package 110 is surface mounted onto a first area of motherboard 14, and then upgrade socket 112 is wave soldered onto a second area of motherboard 14, with the second area encircling the first area. In other words, ($L_1 \times W_1$) and ($L_2 \times W_2$) are coordinated such that original microprocessor package 110 can be surface mounted onto the motherboard 14 in the interior area defined by the center cut out of upgrade socket 112.

Additionally, certain critical dimensions of upgrade socket 112 and upgrade microprocessor package 122 are also resized in a complementary manner. More specifically, the external dimensions ($L_3 \times W_3$) of upgrade socket 112 and the external dimensions ($L_4 \times W_4$) of upgrade microprocessor package 122 are complementary sized, such that pin pattern at the bottom surface 134 of upgrade microprocessor package 122 remains compatible with the receptacle holes 128 of upgrade socket 112, allowing upgrade microprocessor package 122 to mate with upgrade socket 112.

Upgrade microprocessor package 122 contains a turbo upgrade microprocessor designed to tristate the original microprocessor and take over the operation of the computer system. In other words, the upgraded computer system will remain a uniprocessor system. Since the original microprocessor processor will be tristated during operation after upgrade, there will be no thermal dissipation from the original microprocessor. Thus, the fact that the upgrade microprocessor package 122 will be blocking the thermal dissipation path of the original microprocessor is an immaterial issue.

It will be appreciated that under this approach the total motherboard real estate requirement of the combination 110 and 112 is only slightly higher than the motherboard real estate requirement of upgrade socket 12 under the prior art approach, resulting in recovering most of the motherboard real estate previously occupied by original microprocessor package 10 under the prior art approach. It will be further appreciated that the present invention also has another advantage over the prior art in that the critical cooling area is more precisely defined than the prior art approach. A third advantage over the prior art is the trace lengths between the combined package and the cache subsystem are well controlled.

Figure 4:
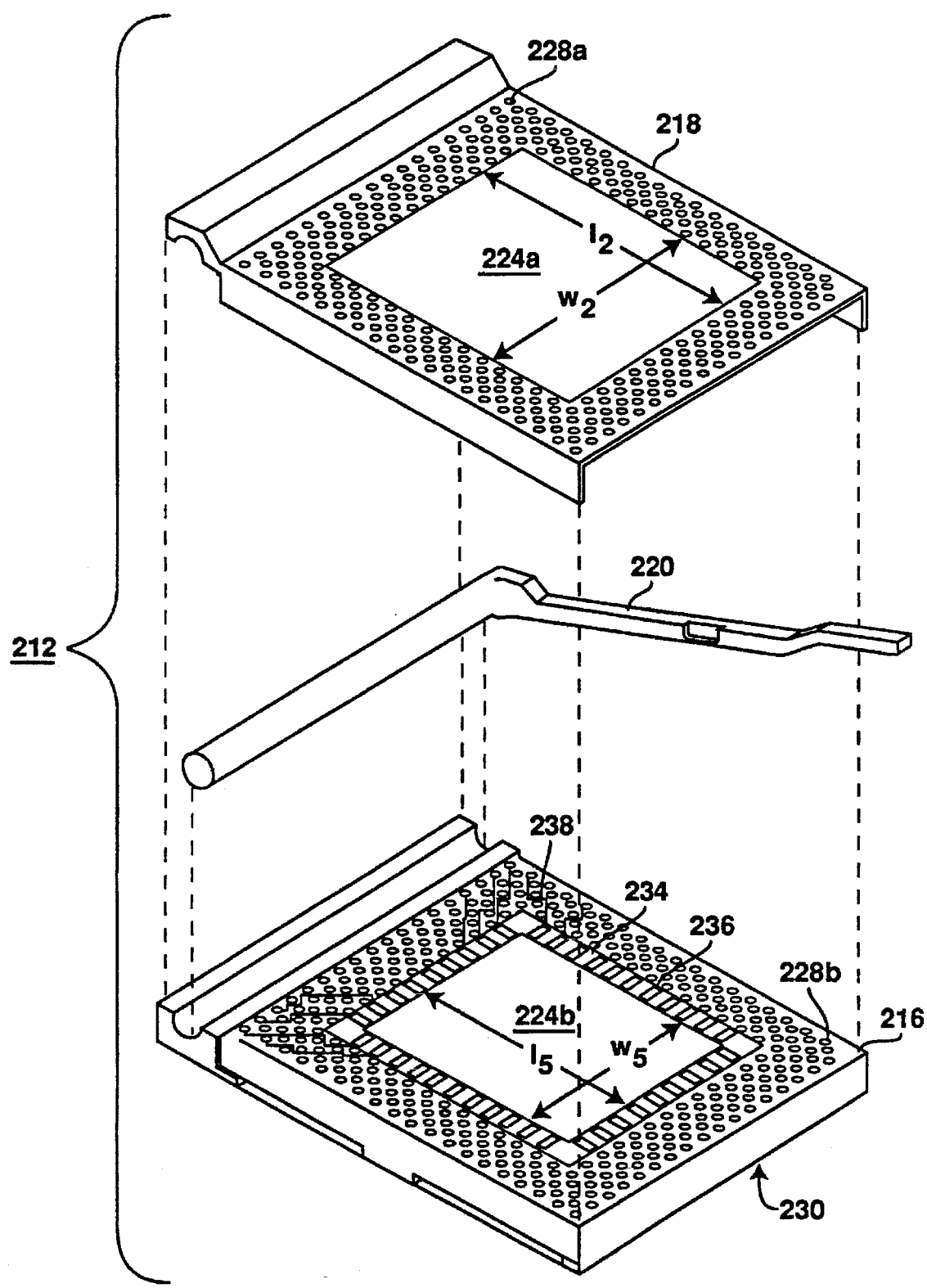
FIG. 4–5 illustrate an alternate embodiment of the present invention, wherein the original processor package in surface mounted onto a newly provided interior perimeter step in the center cut out of the upgrade socket.
Figure 5:
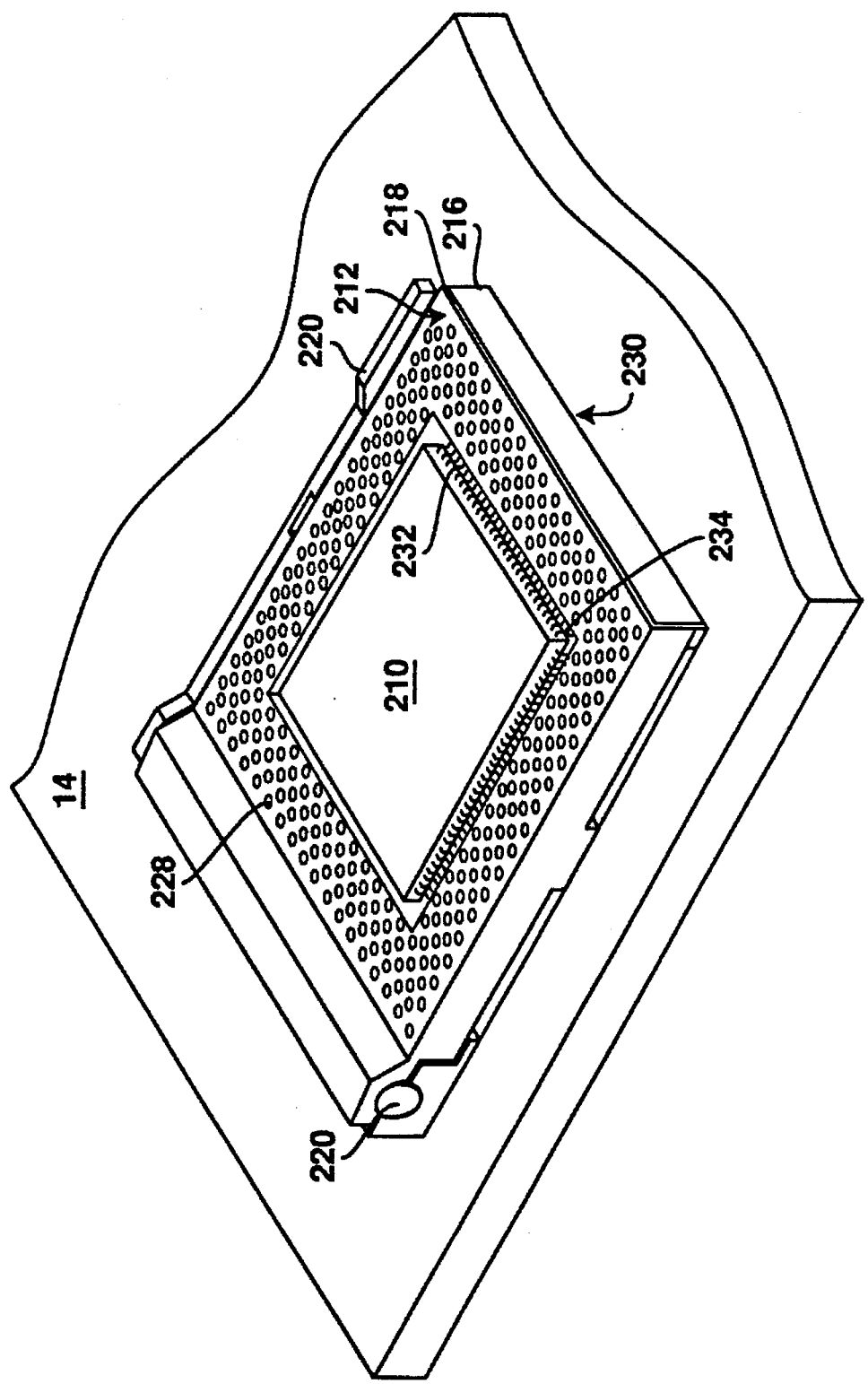

Referring now to FIGS. 4 and 5, which illustrates an alternate embodiment of the present invention. In addition to having the various critical dimensions of original processor package 210, upgrade socket 212, and upgrade microprocessor package (not shown) coordinated as described earlier, bottom portion 216 of upgrade socket 212 is modified to have a smaller center out 224b than top portion 218 of upgrade socket 218, allowing a step 234 to be exposed around the perimeter of center cut out 224a. In other words, ($L_5 \times W_5$) of center cut out 224b are smaller than ($L_2 \times W_2$) of center cut out 224a. A land grid pattern 236 is formed on perimeter step 234, and interconnect wiring circuitry 238 (partially shown) is provided on bottom part 216 of upgrade socket 212 to connect land grid pattern 236 to receptacle holes 228a and 228b of upgrade socket 212.

Original microprocessor package 210 is first solder mounted onto the new perimeter step 234 of upgrade socket 212, physically and electrically connecting extending leads 232 to land grid pattern 236, and then original microprocessor package and upgrade socket combination 210 and 212 is wave soldered onto the motherboard 14.

Upgrade microprocessor package 222 also contains a turbo upgrade microprocessor designed to tristate the original microprocessor and take over the operation of the computer system as a uniprocessor system. For the same reason discussed earlier, the fact that the upgrade microprocessor package 222 will be blocking the thermal dissipation path of the original microprocessor is an immaterial issue, since in typical upgrade situations the first processor is automatically "put to sleep" by the insertion of the upgrade processor.

Similarly, it will be appreciated that under this alternative approach the total motherboard real estate requirement of the combination 210 and 212 is still only slightly higher than the motherboard real estate requirement of upgrade socket 12 under the prior art approach, resulting also in recovering most of the motherboard real estate previously occupied by original microprocessor package 10 under the prior art approach.

Thus, methods and apparatus for providing processor field upgradability to a motherboard has been described. While the methods and apparatus of the present invention have been described in terms of the above illustrated embodiments, those skilled in the art will recognize that the invention is not limited to the embodiments described. The present invention can be practiced with modification and alteration within the spirit and scope of the appended claims. The description is thus to be regarded as illustrative instead of restrictive on the present invention.

I claim:

1. A method for providing processor field upgradability to a motherboard of a computer system, said method comprising the steps of:

(a) surface mounting an original microprocessor package having a rectangular external dimension of length $L_1$ by width $W_1$ onto a first area of the motherboard, resulting in said original microprocessor package being in direct electrical contact with internal circuitry of the motherboard; and (b) wave soldering a processor upgrade socket having a center cut out with a complementary rectangular internal dimension of length $L_2$ by width $W_2$ onto a second area of the motherboard, resulting in said processor upgrade socket being independently in direct electrical contact with said internal circuitry of the motherboard, the first area being encircled by the second area, and the internal dimension of length $L_2$ by width $W_2$ being larger than the external dimension of length $L_1$ by width $W_1$ in length as well as in width, allowing the center cut out to define a cavity having sufficient planar area to accommodate the original microprocessor package, the processor upgrade socket further having a top surface exposing a plurality of electrical receptacles for receiving an upgrade microprocessor package, which, when installed, occupies a spatial position above the original microprocessor package, and places the original microprocessor package in an open state.

2. A motherboard of a computer system comprising:

(a) an original microprocessor package having a rectangular external dimension of length $L_1$ by width $W_1$ surface mounted onto a first area of the motherboard, resulting in the original microprocessor package being in direct electrical contact with internal circuitry of the motherboard; and (b) a processor upgrade socket having a center cut out with a complementary rectangular internal dimension of length $L_2$ by width $W_2$ wave soldered onto a second area of the motherboard resulting in the processor upgrade socket being in independent direct electrical contact with the said internal circuitry of the motherboard, the first area being encircled by the second area, and the internal dimension of length $L_2$ by width $W_2$ being larger than the external dimension of length $L_1$ by width $W_1$ in length as well as in width, allowing the center cut out to define a cavity having sufficient planar area to accommodate the original microprocessor package, the processor upgrade socket further having a top surface exposing a plurality of electrical receptacles for receiving an upgrade microprocessor package, which, when installed, occupies a spatial position above the original microprocessor package, and places the original microprocessor package in an open state.

3. A method for providing processor field upgradability to a motherboard of a computer system, said method comprising the steps of:

(a) surface mounting an original microprocessor package having a rectangular external dimension of length $L_1$ by width $W_1$ onto a perimeter step of a stepped center cut out of a processor upgrade socket, resulting in the original microprocessor package being in electrical contact with electrical receptacles of the processor upgrade socket, the perimeter step having a land grid pattern electrically connecting the original microprocessor package through interconnect circuitry of said processor upgrade socket to said electrical receptacles, the stepped center cut out having a top opening with complementary rectangular internal dimension of length $L_2$ by width $W_2$ and a bottom opening with complementary rectangular internal dimension of length $L_3$ by width $W_3$, the internal dimension of length $L_2$ by width $W_2$ being larger than the external dimension of length $L_1$ by width $W_1$ in length as well as in width, which in turn is larger than the internal dimension of length $L_3$ by width $W_3$ in length as well as in width, allowing the stepped center cut out to define a stepped cavity having sufficient planar area to accommodate the original microprocessor package, the processor upgrade socket further having a top surface exposing said plurality of electrical receptacles for receiving an upgrade microprocessor package, which, when installed, occupies a spatial position above the original microprocessor package, and places the original microprocessor package in an open state; and (b) wave soldering the original processor package and processor upgrade socket combination onto the motherboard, resulting in said electrical receptacles of said original processor package and processor upgrade socket combination being in electrical contact with internal circuitry of the motherboard.

4. A processor upgrade socket comprising:

(a) a bottom portion having a center cut out with a rectangular internal dimension of length $L_3$ by width $W_3$, a land grid pattern disposed along the perimeter of the center out, a first plurality of partial receptacle holes, interconnect wiring circuitry connecting the land grid pattern with the first partial receptacle holes, and a bottom surface having a plurality of pins coupled to said first partial receptacle holes for electrically connecting the first partial receptacle holes to internal wiring circuitry of a motherboard;

(b) a top portion having a center cut out with a complementary rectangular internal dimension of length $L_2$ by width $W_2$ and a second plurality of partial receptacle holes, the top portion being designed to be slidably joint on top of the bottom portion, the first and second plurality of partial receptacle holes being spatially coordinated, the internal dimension of length $L_2$ by width $W_2$ being larger than the internal dimension of length $L_3$ by width $W_3$ in length as well as in width, exposing a first surface area of the bottom portion including said land grid pattern as a perimeter step of the center cut out, forming a stepped cavity for accommodating and electrically connecting an original microprocessor package to the land grid pattern, the original microprocessor package having a complementary rectangular external dimension of length $L_1$ by width $W_1$ which is smaller than the external dimension length $L_2$ by width $W_2$ in length as well as in width; and c) a lever mechanism slidably joining the top and bottom portions together, wherein when joined, the first and second plurality of partial receptacle holes are aligned and electrically connected, and the first and second plurality of parietal receptacle holes being used for receiving and electrically connecting an upgrade microprocessor package to the motherboard, which, when installed, occupies a spatial position above the original microprocessor package, and places the original microprocessor package in an open state.

5. A motherboard of a computer system comprising an original processor package and processor upgrade socket combination wave soldered onto the motherboard, the original processor package and processor upgrade socket combination comprising:

(a) a processor upgrade socket having a stepped center cut out with a sunken perimeter step including a land grid pattern defining a stepped cavity for accommodating and electrically connecting an original microprocessor package to the land grid pattern, the stepped center cut out having a top opening with rectangular internal dimension of length $L_2$ by width $W_2$ and a complementary bottom opening with rectangular internal dimension of length $L_3$ by width $W_3$, the processor upgrade socket further having a top surface exposing a plurality of electrical receptacles disposed for receiving an upgrade microprocessor package, and interconnecting circuitry electrically connecting the land grid pattern and the electrical receptacles, and (b) said original microprocessor package, having a complementary rectangular external dimension of length $L_1$ by width $W_1$, surface mounted onto the perimeter step of the stepped center cut, the internal dimension of length $L_2$ by width $W_2$ being larger than the external dimension of length $L_1$ by width $W_1$ in length as well as in width, wherein the upgrade microprocessor package occupies a spatial position above the original microprocessor package, and the original microprocessor package is placed in an open state, when the upgrade microprocessor package is installed.

* * * * *